United States Patent
Wu et al.

(10) Patent No.: US 12,283,506 B2
(45) Date of Patent: Apr. 22, 2025

(54) HUMIDITY CONTROL DEVICE FOR EQUIPMENT FRONT END MODULE OF SEMICONDUCTOR PROCESSING OR CHARACTERIZATION TOOL

(71) Applicant: Taiwan Semiconductor Manufacturing Company, Ltd., Hsinchu (TW)

(72) Inventors: Ren-Hau Wu, New Taipei (TW); Cheng-Kang Hu, Kaohsiung (TW); Yi-Fam Shiu, Toufen (TW); Cheng-Lung Wu, Zhunan Township (TW); Hsu-Shui Liu, Pingjhen (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 481 days.

(21) Appl. No.: 17/679,223

(22) Filed: Feb. 24, 2022

(65) Prior Publication Data

US 2023/0207359 A1    Jun. 29, 2023

Related U.S. Application Data

(60) Provisional application No. 63/299,574, filed on Jan. 14, 2022, provisional application No. 63/293,465, filed on Dec. 23, 2021.

(51) Int. Cl.
*H01L 21/67* (2006.01)
*H01L 21/673* (2006.01)
*H01L 21/677* (2006.01)

(52) U.S. Cl.
CPC .. *H01L 21/67389* (2013.01); *H01L 21/67766* (2013.01)

(58) Field of Classification Search
CPC .................... H01L 21/67389; H01L 21/67766
See application file for complete search history.

(56) References Cited

U.S. PATENT DOCUMENTS 9,640,416 B2 * 5/2017 Arai .................. H01L 21/67196
9,793,148 B2 * 10/2017 Yamagishi ............ H01L 21/681

FOREIGN PATENT DOCUMENTS

| CN | 101373119 A | 2/2009 |
| JP | 2021007172 A | 1/2021 |
| KR | 20170095749 A | 8/2017 |
| KR | 20200031185 A | 3/2020 |
| TW | 201614085 A | 4/2016 |

* cited by examiner

*Primary Examiner* — Kevin R Barss
(74) *Attorney, Agent, or Firm* — Lippes Mathias LLP

(57) ABSTRACT

A load port receives a wafer carrier. An equipment front end module (EFEM) transfers semiconductor wafers to and from the wafer carrier via an access opening of a housing of the EFEM, and also transfers wafers to and from a semiconductor processing or characterization tool. A gas flow device disposed inside the housing of the EFEM is connected to receive a low humidity gas having relative humidity of 10% or less, and is positioned to flow the received low humidity gas across the access opening. A saturated pressure layer of the gas flow device has a permeability for the low humidity gas that increases with increasing distance from a gas inlet edge of the saturated pressure layer, for example due to holes of varying diameter and/or density passing through the saturated pressure layer. A filter layer of the gas flow device uniformizes the gas exiting the saturated pressure layer.

20 Claims, 8 Drawing Sheets

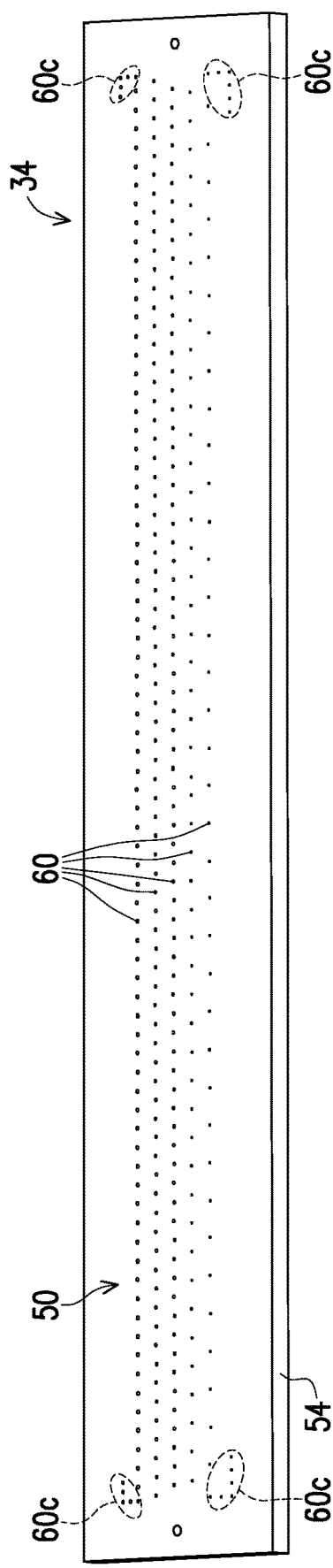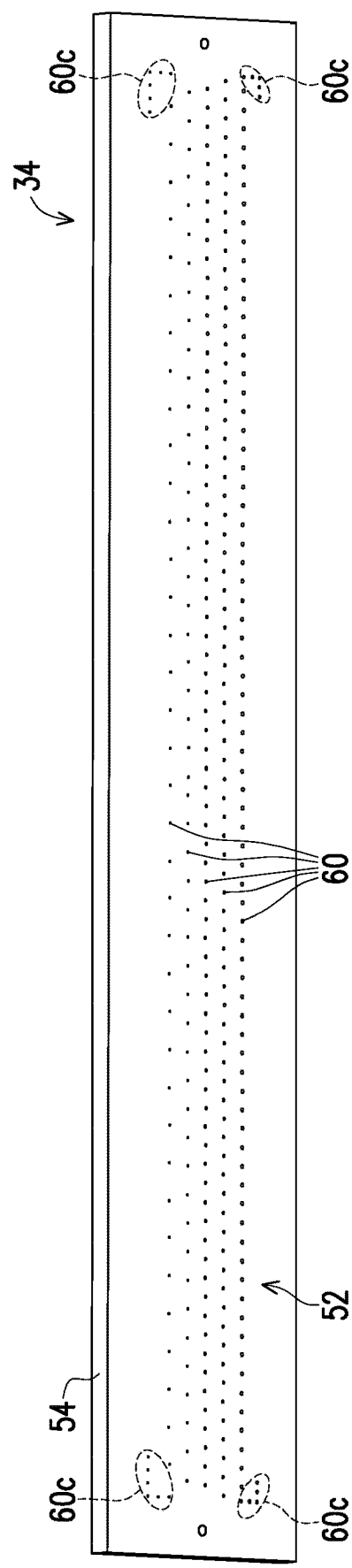
FIG. 5
FIG. 6

HUMIDITY CONTROL DEVICE FOR EQUIPMENT FRONT END MODULE OF SEMICONDUCTOR PROCESSING OR CHARACTERIZATION TOOL

This application claims the benefit of U.S. Provisional Application No. 63/299,574 filed Jan. 14, 2022 titled "WAFER HUMIDITY CONTROL DEVICE". This application claims the benefit of U.S. Provisional Application No. 63/293,465 filed Dec. 23, 2021 titled "WAFER HUMIDITY CONTROL DEVICE". U.S. Provisional Application No. 63/299,574 filed Jan. 14, 2022 titled "WAFER HUMIDITY CONTROL DEVICE" is incorporated herein by reference in its entirety. U.S. Provisional Application No. 63/293,465 filed Dec. 23, 2021 titled "WAFER HUMIDITY CONTROL DEVICE" is incorporated herein by reference in its entirety.

BACKGROUND

The following relates to semiconductor fabrication arts, semiconductor wafer transfer arts, semiconductor fabrication facility arts, equipment front end module (EFEM) arts, and related arts.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 5 and 6 diagrammatically illustrate perspective views showing a top surface (FIG. 5) and a bottom surface (FIG. 6) of the saturated pressure layer of the gas flow device of FIGS. 3 and 4.

DETAILED DESCRIPTION

Figure 1:
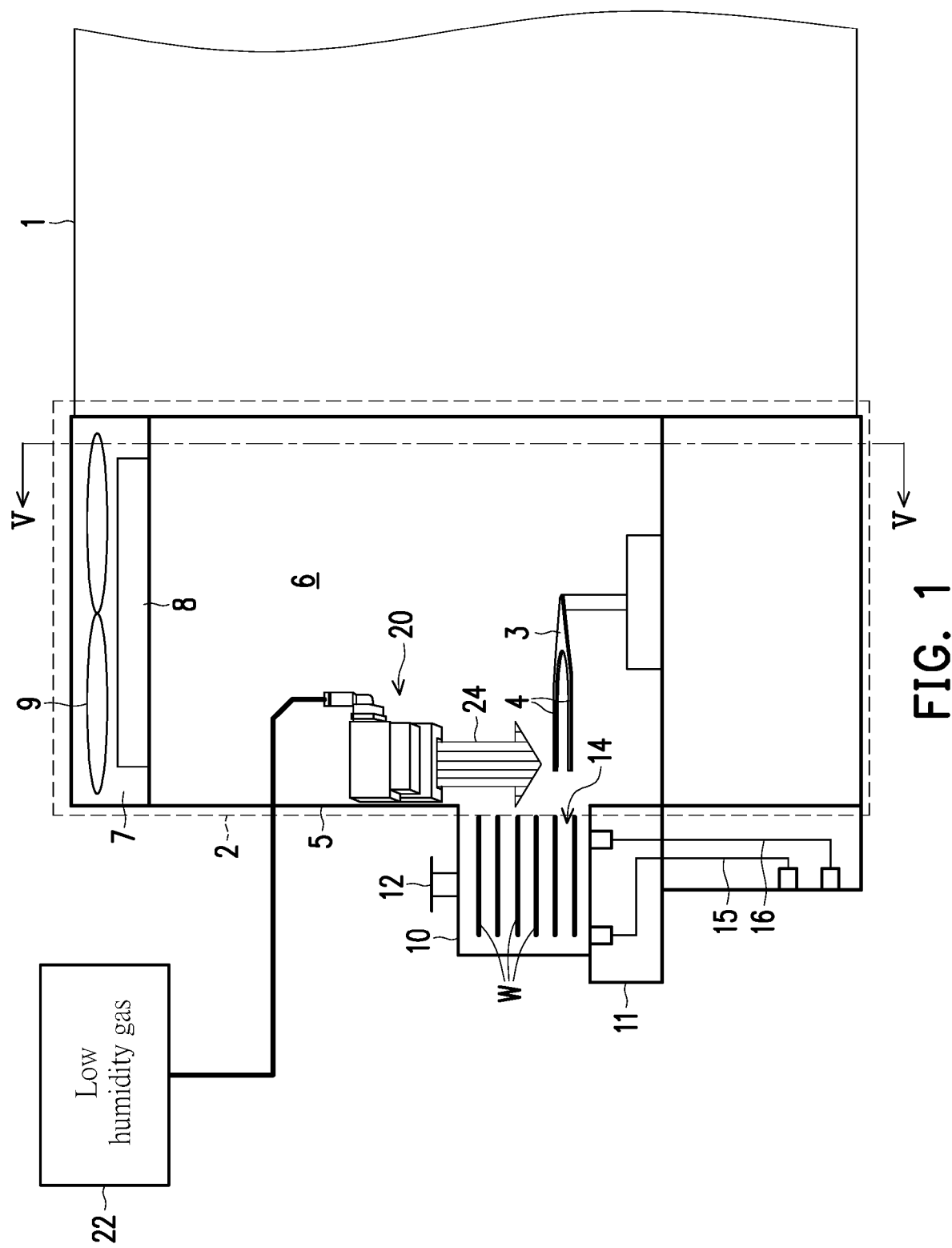
FIG. 1 diagrammatically illustrates a wafer handling apparatus including a load port receiving a wafer carrier, an equipment front end module (EFEM), and a gas flow device disposed inside the EFEM.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In a semiconductor fabrication facility, batches of wafers are transferred in wafer pods, such as a front-opening unified pod (FOUP) that is designed to be compatible with a range of different semiconductor processing and characterization tools. In a typical semiconductor wafer processing workflow for manufacturing integrated circuits (ICs), a semiconductor processing or characterization tool (generically referred to herein as a "tool") includes an equipment front end module (EFEM) with a load port. An overhead transport (OHT) or other automated transportation system delivers a FOUP or other wafer pod to the load port of the tool, and an automated mechanism of the EFEM loads wafers from the FOUP into a process chamber of the tool for processing or characterization. The automated mechanism could be a multi-axis robot or the like, by way of non-limiting illustrative example. The process chamber may be designed with vacuum and/or gas connections to provide a controlled atmosphere for the wafer processing or characterization. For example, the processing chamber may be pumped down to a desired vacuum level, backfilled with nitrogen or forming gas (nitrogen/hydrogen mixture) or another chosen atmosphere, various process gases flowed into the process chamber, or so forth in furtherance of the semiconductor wafer processing or characterization. After the tool has performed the intended processing or characterization, the process chamber is returned (if needed) to a suitable atmosphere for wafer removal, and the automated mechanism of the EFEM unloads the wafers from the process chamber of the tool back into the FOUP or other wafer pod, which is then picked up by the OHT and transferred to the load port of another tool for the next step in the IC processing workflow. This automated wafer handling and transfer provides high efficiency wafer throughput, and (in conjunction with cleanroom facilities) limits wafer contamination by dust, skin cells, or the like shed by fabrication workers or circulated by air handling equipment.

Ideally, the workflow is continuous such that the FOUP or other wafer pod is used only for transporting wafer batches between tools. In practice, however, wafer transfer may be delayed as a tool completes processing or characterization of another batch in the workflow, or due to delays in replacing consumables, or so forth. In these cases, a wafer batch may be stored in its FOUP for some period of time.

In view of such considerations, to further reduce potential for wafer contamination the FOUP or other wafer pod may be a sealed unit, which in some designs can be purged with extreme clean dry air (XCDA), nitrogen to protect the wafers from contaminants and excessive relative humidity. Notably, moisture in the air due to high relative humidity can react with residual materials deposited on the wafers by a previously performed process, and such reactions can form wafer defects that adversely impact IC yield. As a nonlimiting illustrative example, residual chlorine or fluorine gas commonly used in IC processing can react with water to form detrimental wafer defects. Such problems are sometimes more serious for IC fabrication with smaller feature sizes.

As previously noted, purging the FOUP with a purge gas such as nitrogen or XCDA can be beneficial in reducing relative humidity in the FOUP. This entails incorporating gas couplings into the FOUP which automatically connect with purge gas and exhaust lines of the load port of a tool. However, the front opening of a FOUP presents a large-area interface across which gas from the EFEM can pass into the FOUP during wafer transfer to and from the FOUP. Purging of the interior volume of the FOUP may be incomplete due to the presence of constricted regions such as between wafers of the wafer batch. Notably, the semiconductor wafers are typically stored in the FOUP in multiple-slot or multiple-shelf support frames, with small gaps between neighboring wafers of the stack. These spaces between wafers present constricted regions that are difficult to purge.

In embodiments disclosed herein, a humidity control device is integrated into the equipment front end module (EFEM), and in some embodiments positioned at the entranceway where wafers pass across the front opening of the FOUP when transferred to or from the tool.

These and other aspects are further described in detail hereinbelow.

With reference to FIG. 1, a semiconductor processing or characterization tool 1 is serviced by an Equipment Front End Module (EFEM) 2 (more generally, a wafer handling apparatus 2). FIG. 1 diagrammatically depicts a portion of the semiconductor processing or characterization tool 1 by way of a partial box. The semiconductor processing or characterization tool 1 may in general be any type of equipment used in integrated circuit (IC) processing or in characterization of ICs under fabrication on a semiconductor wafer. By way of nonlimiting illustrative example, a semiconductor processing tool 1 could be: a deposition chamber for depositing metal, dielectric, polysilicon, or other types of materials as single layers or layer stacks using a technique such as atomic layer deposition (ALD), sputtering, electron-beam (e-beam) evaporation deposition, radio frequency (RF) plasma deposition, or so forth; an etching chamber for performing plasma-based etching of material; a spinner for spin-on deposition of a material such as a photoresist; a photolithography system for masked exposure of a deposited photoresist layer; a photolithography developer tool; a furnace or rapid thermal annealing (RTA) tool for performing thermal processing of wafers; and/or so forth. By way of nonlimiting illustrative example, a semiconductor characterization tool 1 could be: a scanning electron microscope (SEM) for critical dimension (CD) measurements of IC features (i.e., a CD-SEM); an ellipsometry tool for measuring layer thicknesses; an X-ray diffraction system for performing X-ray-based measurements; or so forth. Again, these are merely nonlimiting illustrative examples, and the EFEM 2 can more generally be the front end module for any type of semiconductor processing or characterization tool 1.

The EFEM 2 includes a robot (e.g., multi-axis robot, linear track robot, or the like) or other automated wafer handling equipment 3 configured to transfer semiconductor wafers W to the semiconductor processing or characterization tool 1. The illustrative automated wafer handler 3 is a robot that includes end effectors 4 for lifting a selected wafer W undergoing handling. Although not illustrated, the wafer handling equipment 3 may optionally also include a wafer aligner or other equipment for performing other wafer handling functionality such as warpage correction, wafer alignment, and/or the like. The EFEM 2 also includes a housing 5 enclosing an interior space 6 of the EFEM 2 within which the automated wafer handling hardware 3 operates. An optional airflow unit 7 disposed in the upper portion of the EFEM 2 includes an air filter 8 through which air from outside of the housing 5 of the EFEM 2 is flowed downward into the interior 6 of the housing 5 of the EFEM 2. By way of nonlimiting illustrative example, the illustrative airflow unit 7 includes a fan 9 driving air from an air inlet duct (not shown) through the air filter 8, which may for example be a high-efficiency particulate absorbing (HEPA) filter 8. The airflow unit 7 advantageously provides filtered air in the interior 6 from which particulates have been removed by the HEPA filter 8, thus reducing the likelihood of particulate contamination of a wafer W being handled by the wafer handling equipment 3 of the EFEM 2. As the EFEM 2 is typically installed in a cleanroom of a semiconductor fabrication facility ("fab"), the optional airflow unit 7 is to be understood as providing additional air filtration at the point of wafer handling.

Figure 2:
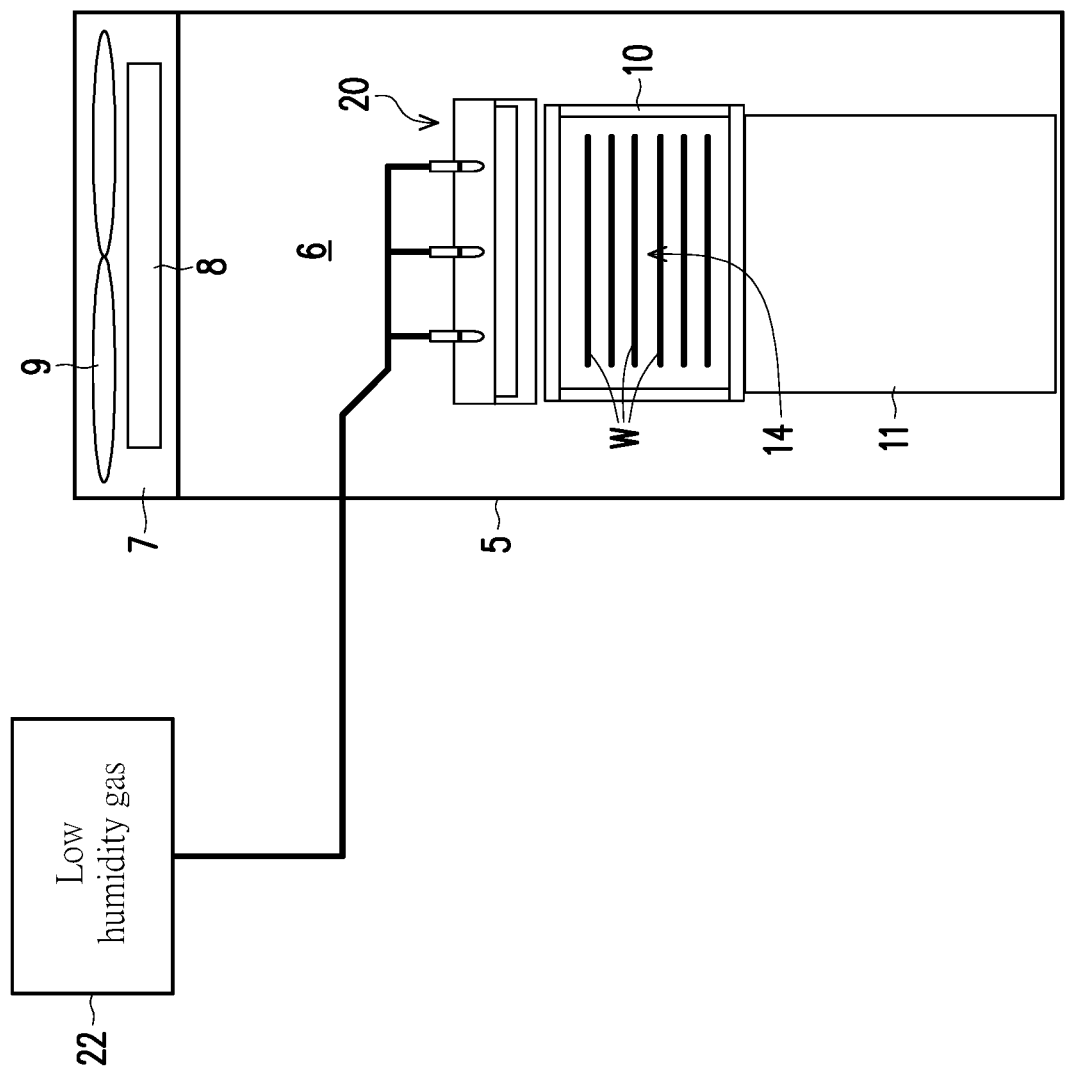
FIG. 2 diagrammatically illustrates the view V-V indicated in FIG. 1 showing the load port and wafer carrier as seen from inside the EFEM.

With continuing reference to FIG. 1 and with further reference to FIG. 2, wafer transfer into the EFEM 2 is further described. A Front Opening Unified Pod (FOUP) 10 (or, more generally, a wafer carrier or wafer storage 10) stores a batch of semiconductor wafers W for processing or characterization by a semiconductor processing or characterization tool 1. The FOUP 10 may include, for example, slots for holding individual wafers. The FOUP 10 is received onto a load port 11 in a fixed position suitably defined by mating alignment pins and/or openings or other alignment features of the FOUP 10 and load port 11. The illustrative FOUP 10 includes a handle or other feature 12 by which a robotic clamp of an overhead transport (OHT) or the like can carry the FOUP 10 and place it onto the load port 11 to deliver a batch of wafers W for processing, and after the processing lift the FOUP 10 off the load port 11 and transport it to a next processing or characterization tool in the workflow. The loading of the FOUP 10 onto the load port 11 typically also involves automated opening of a front door or cover (not shown) of the FOUP 10 and of a corresponding door or cover (not shown) in the proximate vertical wall of the housing 5 of the EFEM 2, the latter operation revealing an access opening 14 defined in the vertical wall of the housing 5 of the EFEM 2. In this regard, FIG. 2 depicts the view V-V indicated in FIG. 1, that is, looking from the interior 6 of the EFEM housing 5 at the access opening 14. In FIG. 2, the robot 3 is also omitted to prevent it from occluding the view of the access opening 14. Preferably, the front opening of the FOUP 10 and the corresponding access opening 14 are designed with a gasket or the like to provide a seal at this connection between the FOUP 10 and the EFEM housing 5. With the FOUP 10 loaded on the load port 11 and the access opening 14 thus established, the robot 3 of the EFEM 2 operates to cause the end effectors 4 to pass through the access opening 14 and lift out a semiconductor wafer W for transfer to the semiconductor processing or characterization tool 1. After the wafer is processed or characterized by the tool 1, the wafer is then transferred out of the tool 1 by the robot 3 and back into the FOUP 10.

It is to be appreciated that the diagrammatically illustrated EFEM 2 and load port 11 for the semiconductor processing or characterization tool 1 are merely an illustrative example, and numerous variants are contemplated. As some nonlimiting examples of such variants, while the illustrated arrangement has a straight-through geometry in which the EFEM 2 is interposed between the load port 11 and tool 1, other geometries can be employed such as a right-hand or left-hand geometry in which (taking the load port as 0° reference angle) the tool 1 is at a +90° or −90° angle so that the wafer path from load port to tool includes a right-angle. In another contemplated variant, if the tool 1 can process more than one wafer at a time then the robotic wafer handling equipment 3 can be more complex such as the including multiple separately manipulable end effectors for simultaneously loading multiple (e.g. two or more) wafers into or out of the tool 1. In a similar variant, a single EFEM 2 may service two or more different tools thus providing simultaneous (different) processing of multiple wafers, and again the robotic wafer handling equipment 3 of the EFEM can be suitably configured to perform the more complex wafer handling thus entailed. In the case of the tool 1 being a furnace or RTA unit or other tool that applies elevated temperature to the wafers W, it is contemplated for the wafers W to be supported on boats (not shown) to facilitate loading and unloading into and out of the tool 1. In other contemplated variants, the EFEM 2 may be designed with multiple load ports 11 for simultaneous placement of two or more FOUPs 10 to increase workflow efficiency. In another contemplated variant, the automatic wafer handling equipment 3 can include a stack of end effectors for simultaneously unloading the entire batch of wafers W from the FOUP 10. Again, these are merely nonlimiting illustrative examples of contemplated variants.

As previously noted, the optional airflow unit 7 with the illustrative HEPA filter 8 can provide a low level of particulates or contaminants in the interior 6 of the EFEM housing 5, which beneficially reduces likelihood of particulate contamination of the wafers W as they are transported through the interior volume 6. However, the airflow unit does not address humidity of the air in the interior 6 of the EFEM housing 5. A problem can arise in that the forced air delivered into the interior 6 by the airflow unit 7 may have a high relative humidity. In general, if the airflow unit 7 delivers ambient air filtered by the HEPA filter 8, then this air is at about the same relative humidity as the air in the cleanroom or other environment. Cleanroom air handling systems typically control relative humidity of the air to be in a range of 30-50% RH (relative humidity), and more commonly around 35-40% RH. (Relative humidity values specified herein are for typical "room temperature" in a cleanroom which is around 19-23° C. for a typical cleanroom, e.g. 21° C. as a typical specific temperature). Various considerations impact the choice of lower RH limit for the cleanroom air. For example, static electricity buildup can increase for RH lower than about 35%. Lowering the cleanroom air to below 30% RH also can produce discomfort for cleanroom personnel, for example leading to cracked or dry skin and potentially also respiratory discomfort.

In a typical EFEM, the forced air provided by the airflow unit 7 can blow into the FOUP 10, which can raise the RH inside the FOUP 10 to about the same RH as the cleanroom air (e.g., 30-35% or higher). This relatively high RH in the FOUP 10 can result in production of residual by-products on the wafers W stored in the FOUP 10. For advanced semiconductor processes in which the line width is narrow, for example, node N16 or smaller critical dimension (CD) size, excessive RH can lead to interaction of by-products producing wafer degradation. That is, a combination of high RH inside the FOUP 10 along with residual chemicals on the wafers W from previous processing steps can lead to deleterious chemical reactions between moisture in the air and residual materials deposited on the wafers by the previous processing. Such reactions can form wafer defects that adversely impact IC yield. As nonlimiting illustrative examples, chlorine or fluorine gas commonly used in IC processing can leave residual chlorine or fluorine compounds on the wafer surface, and these compounds can react with water to form detrimental wafer defects.

One approach for addressing this problem is to provide for purging and backfilling the FOUP 10 with a low humidity gas such as nitrogen. FIG. 1 illustrates such an arrangement in which a gas inlet and outlet lines 15, 16 integrated into the load port 11 enable backfilling the FOUP 10 with nitrogen gas or another dry gas. However, this has some disadvantages. The backfill can only be performed when the front door of the FOUP 10 is sealed, so that the wafers W are exposed to high RH while the FOUP 10 is open to the EFEM 2 via the access opening 14. Furthermore, the FOUP 10 can have confines spaces, such as the gaps between wafers of the batch of wafers W, and these confined spaces may be incompletely purged.

Another option might be to connect the inlet duct of the airflow unit 7 to a source of lower RH gas such as nitrogen or dry air. However, this would entail a high volume of the dry gas, and this high volume flow would be vented into the cleanroom atmosphere, creating and undesirable and potentially unsafe situation (e.g., creating a potential for nitrogen displacement of cleanroom air). Additionally, the dry air forced into the FOUP housing volume 6 would also enter into the tool 1, which could be undesirable depending on the nature of the tool 1.

In embodiments disclosed herein, high RH air in the interior 6 of the housing 5 of the EFEM 2 is blocked from entering into the FOUP 10 by a dedicated gas flow device 20 that is disposed inside the housing 5 of the EFEM 2. The gas flow device 20 is connected to receive a low humidity gas 22 such as extreme clean dry air (XCDA), nitrogen, or the like. In some embodiments, the low humidity gas 22 has relative humidity of 10% or less. The gas flow device 20 is positioned to flow the received low humidity gas across the access opening 14 of the housing 5 of the EFEM 2 through which semiconductor wafers W are transferred to and from the FOUP 10 by the robot 3. This flow of low humidity gas is indicated as a downward arrow 24 in FIG. 1. The humidity control device 20 provides downflow gas 24 for cleanliness at the entrance area (i.e. access opening 14) across which wafers W are transferred to or from the FOUP 10. In particular, the gas flow device 20 limits the amount of humidity entering into the FOUP 10—hence, the gas flow device 20 is also sometimes referred to herein as a humidity control device 20. To this end, in some embodiments the low humidity gas 22 has relative humidity of 10% or less, which facilitates the gas flow device 20 maintaining the relative humidity in the FOUP 10 at a value of 25% or lower. More generally, the low humidity gas 22 suitably has a relative humidity that is sufficiently below the target relative humidity in the FOUP 10 so that the flow of low humidity gas 24 is sufficient to attain that target relative humidity in the FOUP 10. Suitable relative humidity of the low humidity gas 22 to attain the target relative humidity in the FOUP 10 can be readily determined by placing a hygrometer inside the FOUP 10 to measure the relative humidity inside the FOUP 10 during operation such as wafer transfer into or from the FOUP 10 with the humidity control device 20 operating.

While described herein for control of humidity, it will be appreciated that the gas flow device 20 may provide additional and/or other benefits, depending upon the nature of the gas 22 connected with the gas flow device 20. For example, the amount of oxygen gas entering into the FOUP 10 can be limited by choosing nitrogen as the low humidity gas 22. Excessive oxygen exposure to the wafers W can also produce deleterious effects in some instances, for example by contributing to oxidation potentially leading to a change in a surface oxide thickness, as a nonlimiting illustrative example.

The gas flow device 20 controls humidity (and optionally oxygen) ingress into the FOUP 10, thereby providing wafer quality improvement. The various embodiments of the disclosed humidity control device 20 provide various advantages, including wafer quality improvement, for example by control of humidity (and optionally oxygen content) of air (or more generally gas) entering the FOUP 10. The gas flow device 20 generates an air barrier (or more generally a gas barrier, i.e., the downflow gas 24 shown in FIG. 1) to avoid (or at least reduce) humidity entering the FOUP 10. In some nonlimiting illustrative embodiments, the relative humidity in the FOUP 10 is controlled to be less than or equal to 25%, for example by employing the low humidity gas 22 with relative humidity of 10% or less in some nonlimiting illustrative embodiments. A further advantage of the gas flow device 20 is that the flow rate of the low humidity gas can be relatively low since it is particularly directed across the access opening 14. For example, the flow rate of the low humidity gas 22 can be much less than would be required if the low humidity gas were instead connected to the inlet duct of the airflow unit 7 so as to flow the low humidity gas through the entire interior volume 6 of the housing 5 of the FOUP 2. Low consumption of the low humidity gas 22 has numerous advantages, including reduced cost for the consumable low humidity gas 22, reducing or eliminating concern about cleanroom air displacement (e.g., if the low humidity gas 22 is nitrogen), and the option to supply the low humidity gas 22 as a gas cylinder, e.g. a XCDA cylinder or a nitrogen gas cylinder. Furthermore, in some embodiments of the gas flow device 20 disclosed herein, the downflow gas 24 is filtered using an ultra-low particulate air filter (ULPA filter), so that it has a low particulate count, thus (further) reducing likelihood of particulate contamination of the wafers W during transfer into or out of the FOUP 10.

Figure 3:
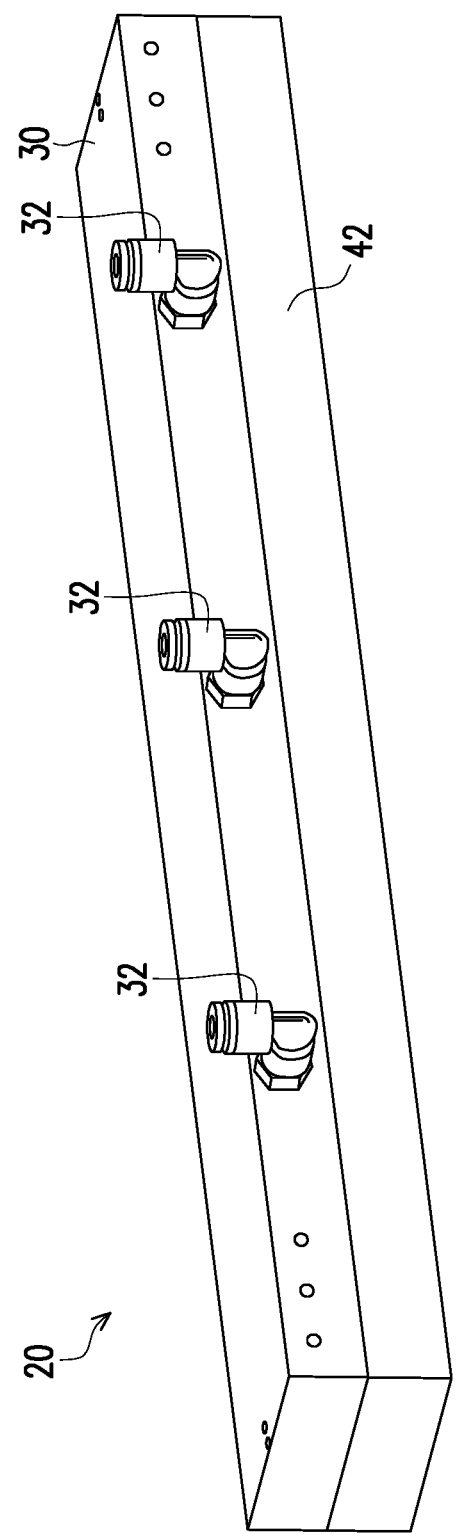
FIG. 3 diagrammatically illustrates a perspective view of an assembled gas flow device.
Figure 4:
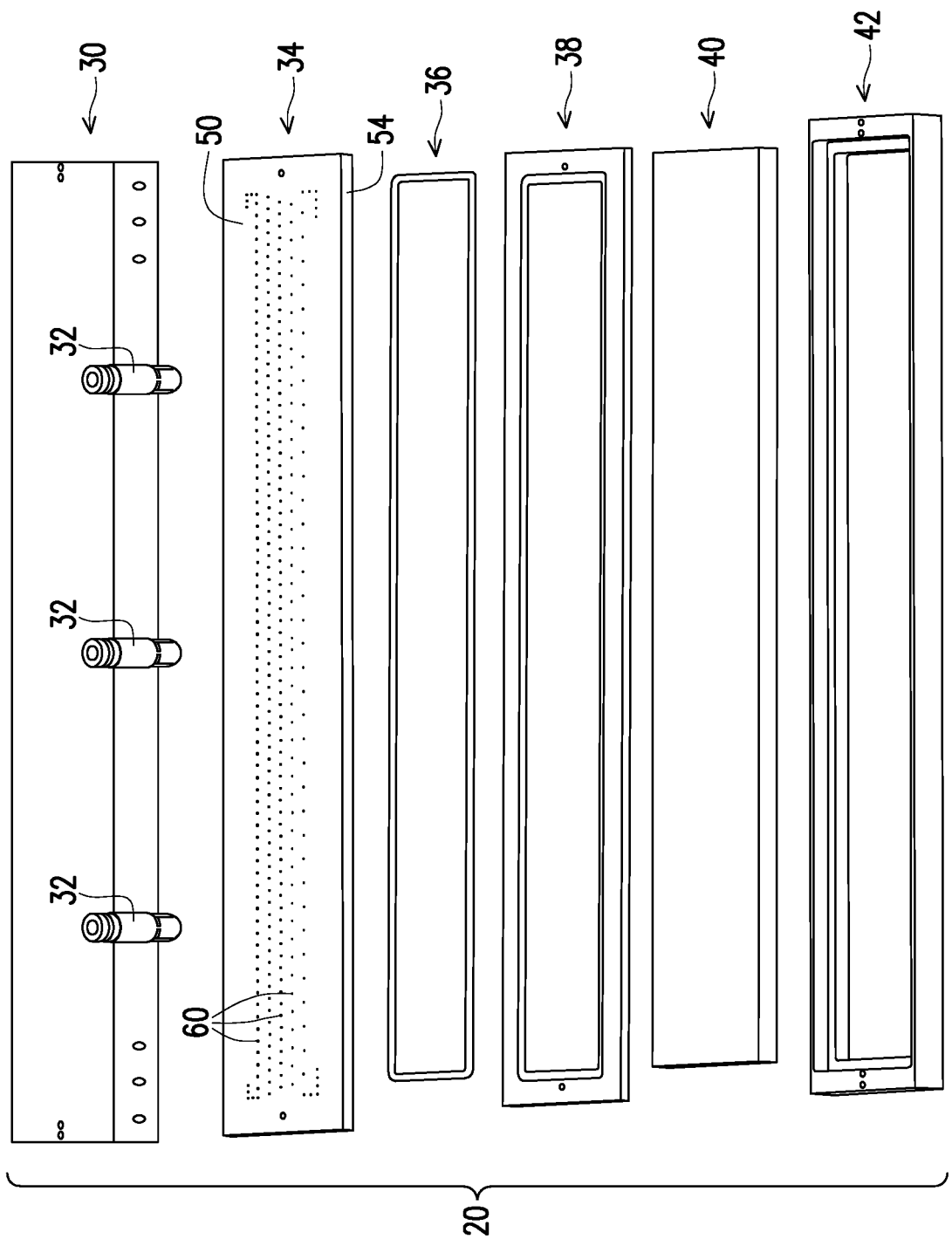
FIG. 4 diagrammatically illustrates an exploded perspective view of the gas flow device of FIG. 3.

With reference now to FIGS. 3 and 4, an illustrative embodiment of the gas flow device 20 is described, which enhances effectiveness of the gas flow device 20 in providing the aforementioned benefits. The illustrative gas flow device 20 produces the downward gas 24 as a well-filtered and spatially uniform gas flow 24 across the access opening 14 that forms a protective air curtain. FIG. 3 diagrammatically illustrates a perspective view of the assembled gas flow device 20, while FIG. 4 diagrammatically illustrates an exploded perspective view of the gas flow device 20. The illustrative gas flow device 20 includes: a gas entry layer 30; one or more (illustrative three) gas nozzles 32; at least one saturated pressure layer 34; at least one O-ring 36; at least one connect layer 38; at least one uniform layer 40; and a diversion layer 42. The humidity control device 20 shown in FIGS. 3 and 4 may suitably serve as the humidity control device 20 shown in the previous FIGS. 1 and 2 in conjunction with the EFEM 2 and load port 11 and FOUP 10.

With continuing reference to FIGS. 3 and 4 and with further reference to FIGS. 5 and 6, in some embodiments the gas entry layer 30 and the saturated pressure layer 34 together create a plenum chamber 30, 34 in which the saturated pressure layer 34 forms a wall of the plenum chamber 30, 34. The saturated pressure layer 34 has a gas inlet surface 50 shown in FIG. 5 which forms an inner surface of the plenum chamber 30, 34, and further has a gas outlet surface 52 shown in FIG. 6 forming an outer surface of the plenum chamber 30, 34. The plenum chamber 30, 34 is connected to receive the low humidity gas 22 into the plenum chamber 30, 34 (via the gas nozzles 32) at a gas inlet edge 54 of the saturated pressure layer 34. The saturated pressure layer 34 has permeability for the low humidity gas 22 that increases with increasing distance from the gas inlet edge 54. In the illustrated example, this permeability that increases with increasing distance from the gas inlet edge 54 is achieved by way of holes 60 that pass through the saturated pressure layer 34 to provide air flow from the gas inlet surface 50 to the gas outlet surface 52. This gradation of permeability of the saturated pressure layer 34 advantageously offsets the gradual decrease in pressure of the gas in the plenum chamber 30, 34 from a highest pressure proximate to the gas inlet edge 54 to a lowest pressure distal from the gas inlet edge 54.

With continuing reference to FIGS. 4-6, the gradation of permeability of the saturated pressure layer 34 is achieved in the illustrative embodiment by a design of holes (i.e. orifices or openings or pores) 60 of the saturated pressure layer 34 which force the low humidity gas steadily into the uniform layer 40 and the diversion layer 42, and this can improve reliability. The holes 60 pass through the saturated pressure layer 34 to allow the low humidity gas flowed across the saturated pressure layer 34 on a side distal from the uniform layer 40 to pass through the holes 20 to reach the uniform layer 40 and diversion layer 42. Put another way, the saturated pressure layer 34 has a gas inlet surface 50 across which the gas from the gas nozzles 32 flow, and a gas outlet surface 52 opposite the gas inlet surface (shown only in FIG. 6) from which the low humidity gas is output toward the uniform layer 40 and diversion layer 42 after passing through the holes 60. The holes 60 pass through the saturated pressure layer 34 from the gas inlet surface 50 to the gas outlet surface 52 to allow gas from the gas nozzles 32 flowing across the gas inlet surface 50 to pass through the saturated pressure layer 34 to exit at the gas outlet surface 52.

Figure 7:
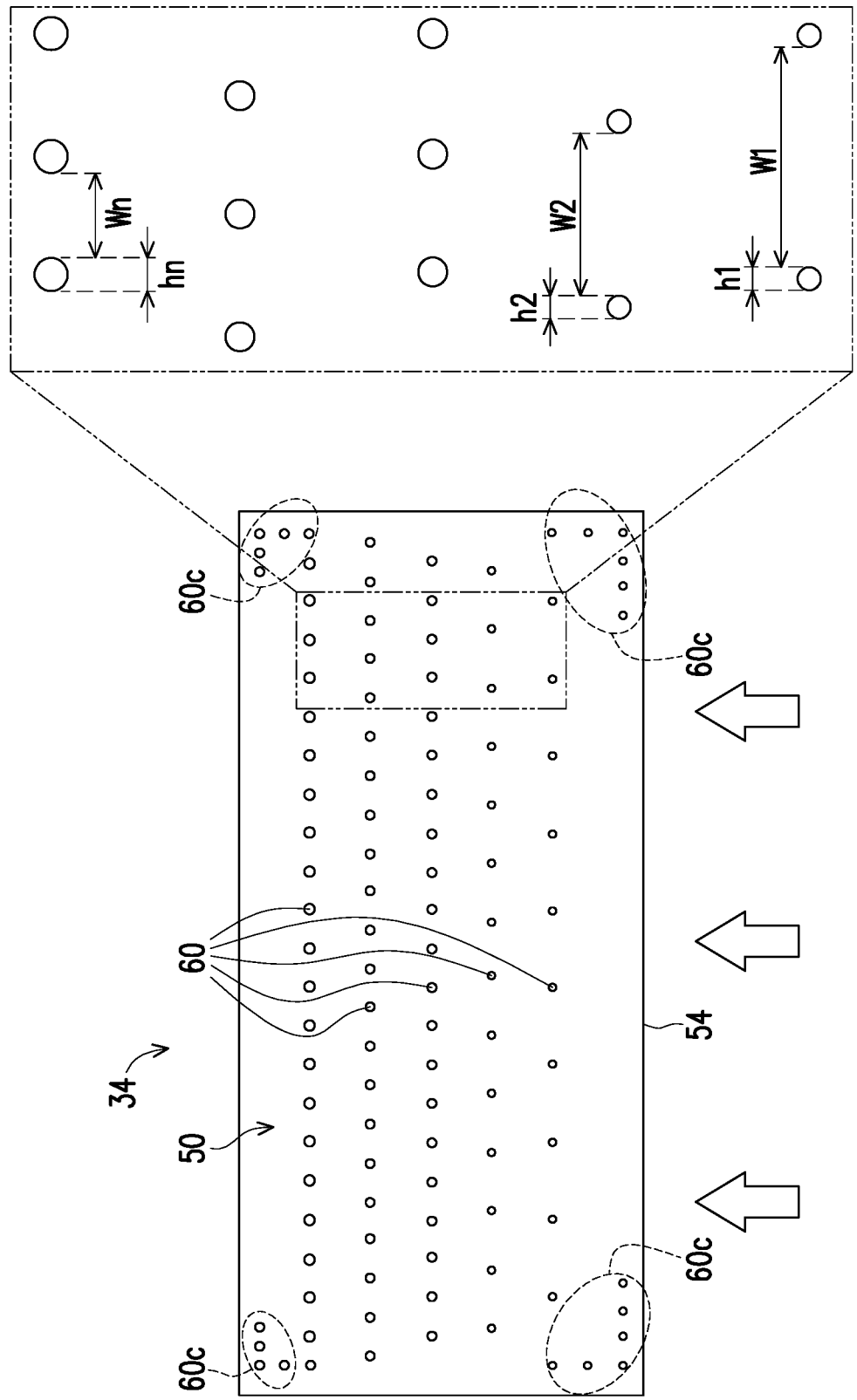
FIG. 7 diagrammatically illustrates a top view of the top surface of a saturated pressure layer with enlarged portion views indicating hole diameters h1, h2, . . . , hn and hole spacing W1, W2, . . . , Wn along the straight lines of holes.

With reference to FIG. 7, a plan (i.e. top) view of a portion of the saturated pressure layer 34 is shown, namely viewing the gas inlet surface 50. In some nonlimiting illustrative embodiments, the saturated pressure layer 34 has the holes 60 with at least two kinds of hole sizes (e.g., arranged in a straight line in the illustrative example). In some nonlimiting illustrative embodiments, extra holes, e.g. an illustrative extra four or more extra holes 60c, are located in each of the four corners of the saturated pressure layer 34. The gas nozzles 32 flow the low humidity gas 22 across (the gas inlet surface 50 of) the saturated pressure layer 34 from the gas inlet edge 54. The closer the distance of the holes 60 to the gas nozzles 32 (or equivalently, the closer to the gas inlet edge 54 of the saturated pressure layer 34), the smaller the hole diameter. Additionally, The closer the distance of the holes 60 to the gas nozzles 32 (or equivalently, the closer to the gas inlet edge 54 of the saturated pressure layer 34), the smaller the number of holes. Referring to FIG. 7 where hole sizes are denoted as h1, h2, . . . , hn, it is seen that the hole sizes h1≤h2≤ . . . ≤hn (where in some nonlimiting illustrative examples h1≥0.1 mm and h1≤3 mm). In some embodiments, strict inequality holds, i.e. h1<h2< . . . <hn. Without being limited to any particular theory of operation, it is believed that having the hole sizes increase with increasing distance from the gas inlet edge 54 (e.g., h1<h2< . . . <hn) advantageously balances against the higher gas flow and/or pressure proximate to the gas inlet edge 54 of the saturated pressure layer 34, so as to provide substantially uniform gas flow rate through the saturated pressure layer 34 over its entire surface area. This provides improved uniformity of the downward gas 24 (see FIG. 1) compared with an alternative design in which the pressure layer 34 has a uniform density and size of holes across its surface.

The hole-to-hole distance for each straight line of holes is denoted as W1, W2, . . . , Wn, and it is seen that W1≥W2≥ . . . >Wn (where in some nonlimiting illustrative embodiments W1≥1 mm and W1≤50 mm). In some embodiments, strict inequality holds, i.e. W1>W2> . . . >Wn. Without being limited to any particular theory of operation, it is believed that having the hole-to-hole distance decrease with increasing distance from the gas inlet edge 54 (e.g., W1>W2> . . . >Wn) advantageously balances against the higher gas flow and/or pressure proximate to the gas inlet edge 54 of the saturated pressure layer 34, so as to provide substantially uniform gas flow rate through the saturated pressure layer 34 over its entire surface area. This provides improved uniformity of the downward gas 24 (see FIG. 1) compared with an alternative design in which the pressure layer 34 has a uniform density and size of holes across its surface. As seen in FIG. 7, both approaches (e.g., W1>W2> . . . >Wn and h1<h2< . . . <hn) can be used in the same embodiment to achieve the desired uniform gas flow rate through the saturated pressure layer 34 over its entire surface area.

Put another way, the density of holes 60 increases with increasing distance away from the gas nozzles 32 (or, equivalently, with increasing distance away from the gas inlet edge 54), and/or the diameters of the holes 60 increases with increasing distance away from the gas nozzles 32 (or, equivalently, with increasing distance away from the gas inlet edge 54). It should be noted that while hole size is referred to by "diameter" herein implying circular holes or orifices 60, more generally the holes or orifices 60 may have other cross-sectional geometries, e.g. square holes.

In illustrative FIGS. 5-7, the holes 60 (other than the corner holds 60c) are arranged in mutually parallel straight lines that are also parallel with the gas inlet edge 54 of the saturated pressure layer 34. The straight line of holes of smallest diameter h1 are closest to the gas inlet edge 54 and have the largest spacing W1. The straight line of holes of next smallest diameter h2 are next-closest to the gas inlet edge 54 and have the next-largest spacing W2, and so forth until the last straight line of holes of largest diameter hn are furthest away from the gas inlet edge 54 and have the smallest spacing Wn. In some nonlimiting illustrative embodiments, the saturated pressure layer 34 comprises a solid material of thickness 20 mm or less. The saturated pressure layer 34 may be made of various materials. For example, in some nonlimiting illustrative embodiments, the saturated pressure layer 34 may be made of (i.e. comprise) a plastic or polymer such as polyethylene terephthalate (PET), high-density polyethylene (HDPE), polyvinyl chloride (PVC), low-density polyethylene (LDPE), Polypropylene (PP), Polystyrene (PS), ultra-high molecular weight polyethylene (UPE), or polyethylene (PE), as some nonlimiting illustrative examples. In other nonlimiting illustrative embodiments, the saturated pressure layer 34 may be made of (i.e. comprise) a metal such as an aluminum alloy, a stainless steel, or a titanium alloy, as some nonlimiting illustrative examples. In other nonlimiting illustrative embodiments, the saturated pressure layer 34 may be made of (i.e. comprise) a glass material such as quartz as a nonlimiting illustrative example. In other nonlimiting illustrative embodiments, the saturated pressure layer 34 may be made of (i.e. comprise) a ceramic material such as aluminum oxide ($Al_2O_3$) or zirconium oxide ($ZrO_2$), as some nonlimiting illustrative examples.

In other contemplated embodiments, the holes 60 may have arrangements other than straight lines, with the hole sizes increasing with increasing distance away from the gas inlet edge 54 and/or with the density of holes increasing with increasing distance away from the gas inlet edge 54. Without being limited to any particular theory of operation, it is believed that having the hole density and/or hole size of the saturated pressure layer 34 increase with increasing distance from the gas inlet edge 54 as seen in the example of FIG. 7 advantageously balances against the higher gas flow and/or pressure proximate to the gas inlet edge 54 of the saturated pressure layer 34, so as to provide substantially uniform gas flow rate through the saturated pressure layer 34 over its entire surface area. This provides improved uniformity of the downward gas 24 (see FIG. 1) compared with an alternative design in which the pressure layer 34 has a uniform density and size of holes across its surface. The detailed values for the hole diameters and hole density (or, analogously, hole-to-hole spacing) can be optimized for a given design empirically and/or using computer simulations of the gas flow for different hole configurations to achieve the desired uniformity of the gas flow rate through the saturated pressure layer 34 over its surface area.

Again without being limited to any particular theory of operation, it is believed that the optional extra holes 60c located in each of the four corners of the saturated pressure layer 34 provide for tailoring of the gas flow through the saturated pressure layer 34 at the corners to avoid stagnant zones at the corners and consequent nonuniformity of gas flow 24 at the corners of the saturated pressure layer 34. The detailed configurations of the extra corner holes 60c (e.g., number of holes, hole diameter and arrangement) can again be optimized for a given design empirically and/or using computer simulations of the gas flow for different corner hole configurations.

The illustrative saturated pressure layer 34 achieves permeability for the low humidity gas that increases with increasing distance from the gas inlet edge 54 by way of the increasing diameter h1, h2, . . . , hn and/or decreasing spacing W1, W2, . . . , Wn of the holes 60 with increasing distance away from the gas inlet edge 54. However, other arrangements for achieving permeability for the low humidity gas that increases with increasing distance from the gas inlet edge 54 are contemplated. As a further nonlimiting example, the saturated pressure layer could be a mat of randomly arranged fibers, such as a high-efficiency particulate air (HEPA) filter, in which the fiber density decreases with increasing distance from the gas inlet edge so as to make the HEPA filter increasingly gas permeable with increasing distance from the gas inlet edge.

With returning reference to FIG. 4, the uniform layer 40 in a nonlimiting illustrative embodiment comprises a filter layer. The diversion layer 42 is at the bottom of the humidity control device 20. In some nonlimiting illustrative embodiments, the thickness T of the diversion layer 42 is greater than a thickness of the uniform layer 40, and the uniform layer 40 may optionally be installed in the diversion layer 42 (e.g., the uniform layer 40 may partially or fully seat within the diversion layer 42. In some nonlimiting illustrative embodiments, the thickness of the diversion layer 42 is greater than or equal to 3 mm. In some nonlimiting illustrative embodiments, the uniform layer 40 may be made of (i.e. comprise) a plastic or polymer material such as polyethylene terephthalate (PET), high-density polyethylene (HDPE), polyvinyl chloride (PVC), low-density polyethylene (LDPE), polypropylene (PP), polystyrene (PS), ultra-high molecular weight polyethylene (UPE), or polyethylene (PE), as some nonlimiting illustrative examples. The diversion layer 42 extending below the uniform layer 40 can improve reliability, for example by guiding the gas flow forming the downflow gas 24 output by the humidity control device 20 to create a well-defined air curtain protecting the access opening 14 of the housing 5 of the EFEM 2.

Figure 8:
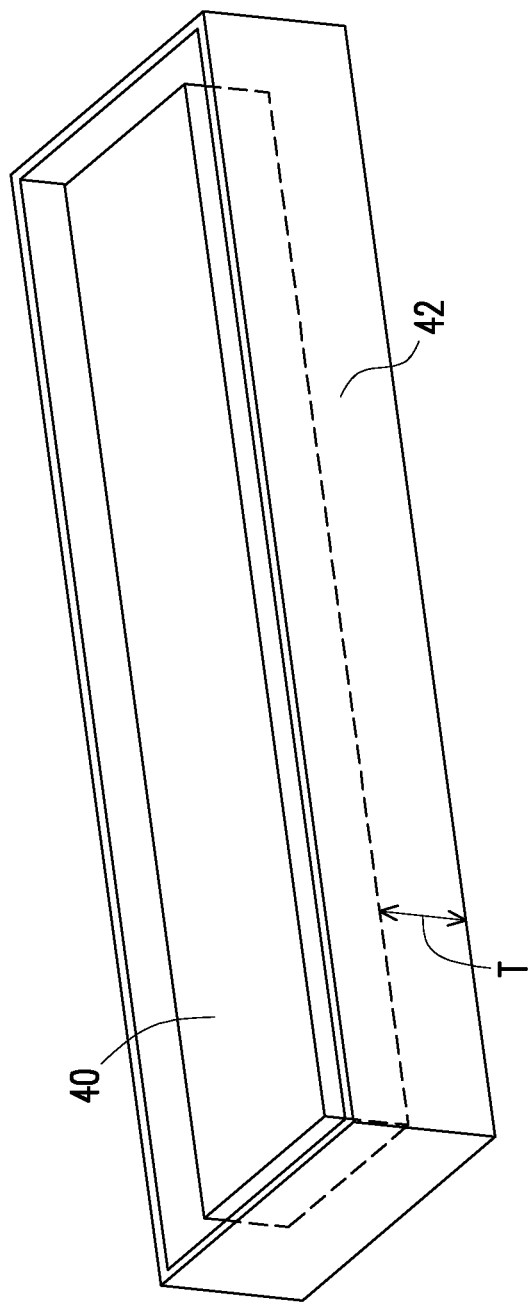
FIG. 8 diagrammatically illustrates a perspective view of the uniform layer (e.g. filter layer) and diversion layer of the gas flow device of FIGS. 3 and 4.
Figure 9:
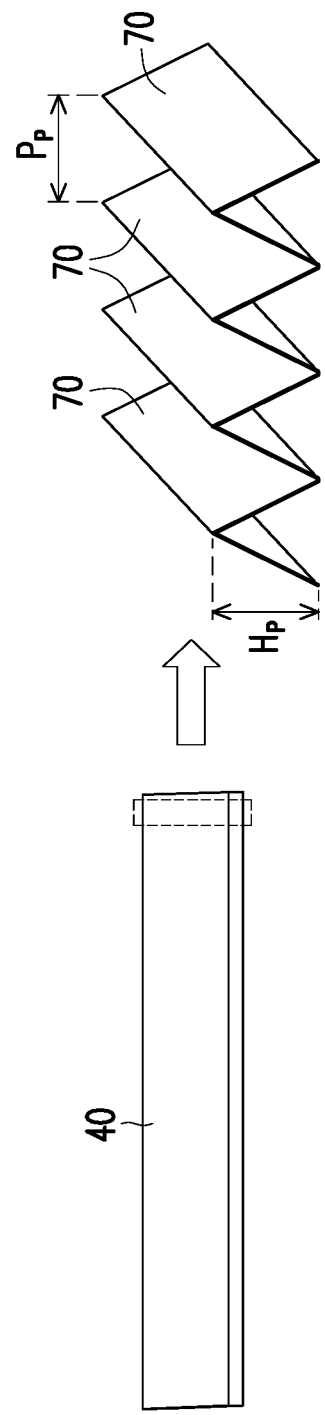
FIG. 9 diagrammatically illustrates a perspective view of the uniform layer implemented as a pleated filter layer, with an enlarged portion view illustrating several pleats of the pleated filter layer.

With continuing reference to FIG. 4 and with further reference now to FIGS. 8 and 9, in some embodiments the uniform layer 40 is a filter layer 40. For example, the filter layer 40 may be an ultra-low particulate air (ULPA) filter which advantageously provides strong filtering of particulates from the downflow gas 24 output by the humidity control device 20. In another nonlimiting illustrative example, the filter layer 40 may be a HEPA filter. In the illustrative embodiment of FIG. 8, the diversion layer 42 forms a filter receptacle in which the filter layer 40 is disposed. In some nonlimiting illustrative embodiments, the filter receptacle 42 has a thickness T of at least 3 millimeters. As illustrated in FIG. 9, in some nonlimiting illustrative embodiments the filter layer 40 is a pleated filter layer having pleats 70. In some such embodiments, the pleats 70 have a pleat height $H_P$ of 40 mm or less and a pleat pitch $P_P$ of greater than or equal to 0.1 mm. In one nonlimiting illustrative example in which the uniform layer 40 is a pleated ULPA filter with a length of 400 mm, the number of pleats 70 is greater than or equal to 400. In another nonlimiting illustrative example, the pitch $P_P$ of the pleats 70 is in a range of 0.1 mm to 2 mm, and a height $H_P$ of the pleats 70 is in a range of 2 mm to 40 mm.

With returning reference to FIG. 4, the connecting layer 38 serves to connect the upper submodule (i.e. plenum chamber) 30, 34 including the gas entry layer 30 and saturated pressure layer 34 and the lower submodule including the diversion layer 42 and the filter or other uniform layer 40. The connecting layer 38 provides a finite spacing between these two submodules. In some embodiments, the connecting layer 38 has a thickness effective to ensure a 0.5 mm or larger spacing between the upper submodule 30, 34 and the lower submodule 40, 42. Typically, the connecting layer 38 has a thickness of at least 0.5 mm and less than 50 mm.

Thus, with returning reference to FIG. 1, the load port 11 receives a wafer carrier 10 (for example, an illustrative FOUP 10). The EFEM 2 transfers semiconductor wafers W to and from the wafer carrier 10 via the access opening 14 of the housing 5 of the EFEM 2, and also transfers the wafers W to and from the semiconductor processing or characterization tool 1. The gas flow device 20 disposed inside the housing 5 of the EFEM 2 is connected to receive the low humidity gas 22 (having relative humidity of 10% or less in some embodiments), and is positioned to flow the received low humidity gas across the access opening 14 (e.g. as downflow gas 24). As shown in most detail in FIGS. 5-7, the saturated pressure layer 34 of the gas flow device 20 has a permeability for the low humidity gas 22 that increases with increasing distance from the gas inlet edge 54 of the saturated pressure layer 34. The variable permeability of the saturated pressure layer 34 may be due to holes 60 of varying diameter and/or density passing through the saturated pressure layer 34. A filter layer 40 is arranged to receive and uniformize the low humidity gas exiting the saturated pressure layer 34.

The illustrative embodiments are to be understood as nonlimiting illustrative examples, and numerous variants thereof are contemplated. By way of nonlimiting example of some further contemplated variants are described below.

The O-ring 36 and/or connect layer 38 of FIG. 4 can be replaced by a sealing gasket or other sealing mechanism and/or other hardware for connecting the gas entry layer 30 and the subassembly of the uniform layer 40 and diversion layer 42.

While FIG. 1 shows the humidity control device 20 arranged to produce downflow gas 24 directed downward, other orientations of the humidity control device 20 and output gas flow 24 are contemplated. In one variant embodiment, the humidity control device is oriented so that the downflow gas is partly directed toward the access opening 14 to drive some of the low humidity air 22 into the FOUP 10.

With respect to the illustrative saturated pressure layer 34 with holes 60 of designed variable size (e.g., $h1<h2<\ldots<hn$) and distribution ($W1<W2<\ldots<Wn$) as shown in FIG. 7, in a variant embodiment the diameters of the holes 60 may vary (e.g. varying diameters $h1<h2<\ldots<hn$) while the spacings between the holes of different diameter may be the same (i.e., $W1=W2=\ldots=Wn$) (i.e., the density of holes is uniform). Similarly, in another variant embodiment the diameters of the holes 60 may be the same ($h1=h2=\ldots=hn$) while the spacings between the holes may vary ($W1<W2<\ldots<Wn$) (or more generally, the density of the holes may be nonuniform and increasing with increasing distance from the gas inlet edge 54).

In yet another variant, the holes 60 need not be arranged in mutually parallel straight lines as in the embodiment of FIGS. 5-7. In another embodiment, the holes are arranged in a grid of square, hexagonal, or octagonal cells, with the diameter and/or density of the holes increasing with increasing distance away from the gas inlet edge 54.

In another variant, the saturated pressure layer 34 with holes 60 of designed variable size and/or distribution (or other source of spatially varying gas permeability) can be used without the uniform layer 40 and/or without the diversion layer 42.

The disclosed gas flow device 20 providing gas flow 24 (see example of FIG. 1) can be used for purposes other than or in addition to humidity control, such as for particulate control, oxygen control, and/or so forth. In this regard, the gas flowing into the gas flow device 20 through the gas nozzles 32 may be chosen for a given application, e.g. the gas may be filtered and/or purified air (e.g., extreme clean dry air, i.e. XCDA) of a chosen relative humidity, or may be nitrogen, a noble gas, or may be some other chosen gas.

As another variant, the gas flow device 20 may have a configuration other than that described with reference to FIGS. 3-9. For example, the gas flow device may be any device capable of flowing a gas that is disposed inside the housing 5 of the EFEM 2 and connected to receive a low humidity gas 22 (e.g., having relative humidity of 10% or less) and positioned to flow the received low humidity gas across the access opening 14 of the housing 5 of the EFEM 2. Other approaches for providing a uniform downflow of gas are contemplated, such as employing a stack of HEPA filters with a final ULPA filter to diffuse inlet gas into a uniform curtain of gas, for example.

As another variant, the humidity control device 20 can be advantageously used either alone or in combination with the gas inlet and outlet lines 15, 16 shown in FIG. 1 as integrated into the load port 11 to enable backfilling the FOUP 10 with nitrogen gas or another dry gas. The combination of these two systems advantageously combats high humidity in the FOUP 10 both by the humidity control device 20 limiting ingress of humid air via the access opening 14 during wafer transfer, and by further purging the FOUP 10 after the front opening of the FOUP 10 is closed. As previously noted, it may be difficult to purge confined spaces within the FOUP 10 such as in the gaps between neighboring wafers W—hence, the additional suppression of humid air ingress by the humidity control device 20 can work synergistically with the FOUP purging by reducing the amount of humidity to be purged.

Figure 10:
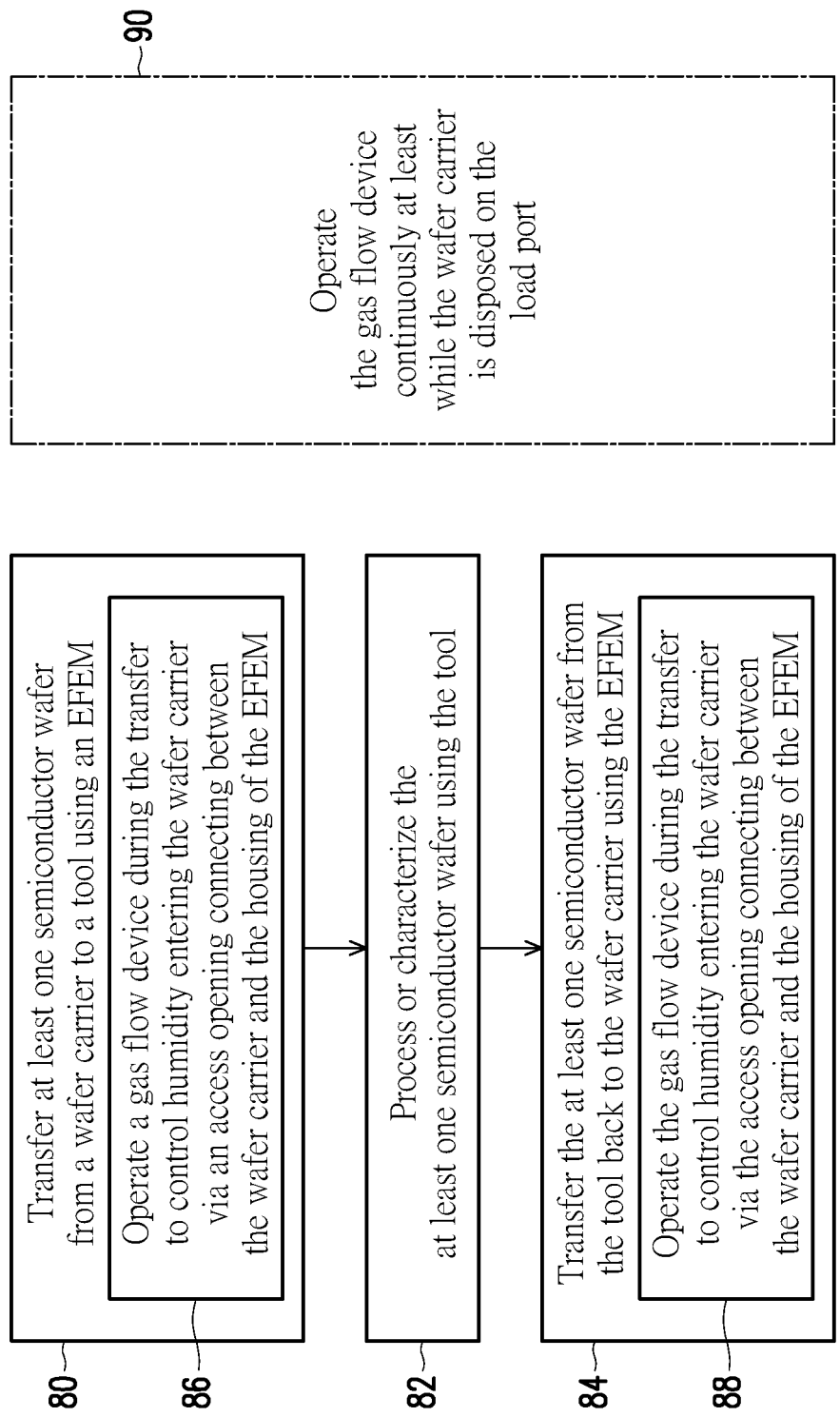
FIG. 10 diagrammatically illustrates a wafer handling method utilizing a gas flow device disposed inside the housing of an EFEM.

With reference back to FIG. 1 and with further reference to FIG. 10, a wafer handling method is disclosed which utilizes a gas flow device such as that of FIGS. 3-9. In an operation 80, at least one semiconductor wafer W is transferred from the FOUP or other wafer carrier 10 to the semiconductor processing or characterization tool 1 using the EFEM 2. For example, the wafer transfer may be performed by the robot 3 of FIG. 1. In an operation 82 (which in some embodiments may not be considered part of the wafer handling method itself) the at least one semiconductor wafer W is processed or characterized using the semiconductor processing or characterization tool 1. For example, the operation 82 may comprise wafer processing such as material deposition, material etching, lithographic processing (e.g., exposure or development), thermal processing such as annealing, or so forth; or the operation 82 may comprise wafer characterization such as microscopy measurements using an SEM, optical, or other type of microscope, ellipsometry measurements performed using an ellipsometer, X-ray diffraction measurements performed using an X-ray diffractometer, or so forth. In an operation 84, after the processing or characterization 82 is complete the at least one wafer W is transferred from the semiconductor processing or characterization tool 1 back to the wafer carrier 10 using the EFEM 2.

To control humidity entering the wafer carrier 10 during the transfer operations 80 and 84, the gas flow device 20 is operated at least during the transfer operations 80 and 84. Specifically, in an operation 86 the gas flow device 20 is operated during the transfer operation 80, and in an operation 88 the gas flow device 20 is operated during the transfer operation 84. This is a minimum time of operation to provide the desired humidity control (assuming the door of the wafer carrier 10 is closed except during the transfer operations 80 and 84), and operating only during this minimum time of operation advantageously minimizes consumption of the low humidity gas 22.

More generally, the gas flow device 20 may be operated over one or more longer time intervals that encompass the time intervals of the transfer operations 80 and 84. For example, in an alternative embodiment indicated by the dashed box 90 in FIG. 10, the gas flow device 20 may be operated continuously at least while the wafer carrier 10 is disposed on the load port 11. For example, the load port 11 can include a switch that is activated by placement of the wafer carrier 10 on the load port 11 (e.g., the wafer carrier 10 placed on the load port can depress a plunger switch), and the activation of the switch turns on the gas flow device 20. Such a switch may already be present to control other operations, such as automatically opening the front door of the FOUP 10 when it is placed onto the load port 11, and in such a case the signal produced by the switch can additionally be used to control the gas flow device 20. This continuous operation 90 provides potentially improved humidity control compared with operating the gas flow device 20 only during the transfer operations (as per illustrative operations 86 and 88) by establishing the low humidity gas downflow 24 some time prior to and after each transfer operation 80, 84. Additionally, the continuous operation approach of operation 90 is suitable if the door of the wafer carrier 10 is kept open during the entire time the wafer carrier 10 is disposed on the load port 11. However, operation 90 uses a higher consumption of the low humidity gas 22 when compared with the minimum time of operation 86 and 88.

In another contemplated variant, the gas flow operation 90 is performed continuously regardless of whether the load port 11 has received a wafer carrier 10. For example, in this variant the gas flow device 20 may include a manually operated on/off switch and is ordinarily switched on whenever the tool 1 is scheduled for use in a semiconductor processing or characterization workflow. This provides a mechanically straightforward construction but will use the highest quantity of the low humidity gas 22.

In the following, some further embodiments are described.

In a nonlimiting illustrative embodiment, a gas flow device includes: at least one saturated pressure layer having a gas inlet surface, a gas outlet surface, and holes passing through the saturated pressure layer from the gas inlet surface to the gas outlet surface; one or more gas nozzles arranged to flow a gas over the gas inlet surface of the saturated pressure layer from a gas inlet edge of the saturated pressure layer; a gas entry layer disposed at the gas inlet surface of the saturated pressure layer; and at least one uniform layer disposed at the gas outlet surface of the saturated pressure layer. At least one of (i) a size of the holes passing through the saturated pressure layer increases with increasing distance from the gas inlet edge of the saturated pressure layer and/or (ii) a density of the holes passing through the saturated pressure layer increases with increasing distance from the gas inlet edge of the saturated pressure layer. In some such embodiments, the uniform layer comprises a pleated filter layer. In some such embodiments, the gas flow device further includes at least one O-ring and at least one connect layer disposed at the gas outlet surface of the saturated pressure layer and providing a sealed connection between the gas outlet surface and the at least one uniform layer.

In a nonlimiting illustrative embodiment, a wafer handling apparatus includes a load port, an equipment front end module (EFEM), and a gas flow device. The load port is configured to receive an associated wafer carrier. The EFEM has a housing and is configured to transfer semiconductor wafers to and from the associated wafer carrier received at the load port via an access opening of the housing of the EFEM. The EFEM is further configured to transfer the semiconductor wafers to and from an associated semiconductor processing or characterization tool. The gas flow device is disposed inside the housing of the EFEM and is connected to receive a low humidity gas having relative humidity of 10% or less, and the gas flow device is positioned to flow the received low humidity gas across the access opening of the housing of the EFEM.

In some embodiments of the wafer handling apparatus of the immediately preceding paragraph, the gas flow device includes a plenum chamber. The plenum chamber includes a saturated pressure layer forming a wall of the plenum chamber. The saturated pressure layer has a gas inlet surface forming an inner surface of the plenum chamber and a gas outlet surface forming an outer surface of the plenum chamber. The plenum chamber is connected to receive the low humidity gas into the plenum chamber at a gas inlet edge of the saturated pressure layer, and the saturated pressure layer has permeability for the low humidity gas that increases with increasing distance from the gas inlet edge.

In some embodiments of the wafer handling apparatus of the immediately preceding paragraph, the saturated pressure layer has holes passing through the saturated pressure layer from the gas inlet surface to the gas outlet surface, and the permeability for the low humidity gas that increases with increasing distance from the gas inlet edge is provided by at least one of (i) a size of the holes passing through the saturated pressure layer that increases with increasing distance from the gas inlet edge of the saturated pressure layer and/or (ii) a density of the holes passing through the saturated pressure layer that increases with increasing distance from the gas inlet edge of the saturated pressure layer.

In some embodiments of the wafer handling apparatus of any of the immediately preceding three paragraphs, the gas flow device further includes a filter layer arranged to receive the low humidity gas exiting the plenum chamber at the gas outlet surface of the saturated pressure layer.

In some embodiments of the wafer handling apparatus of any of the immediately preceding four paragraphs, the load port is configured to receive the associated wafer carrier comprising a front opening unified pod (FOUP), and the access opening of the housing of the EFEM is configured to mate with a front opening of the FOUP.

In a nonlimiting illustrative embodiment, a wafer handling method is disclosed. At least one semiconductor wafer is transferred from a wafer carrier to a tool using an EFEM. After processing or characterization of the at least one semiconductor wafer using the tool, the at least one semiconductor wafer is transferred back from the tool to the wafer carrier using the EFEM. At least during the transferring operations, a gas flow device disposed inside a housing of the EFEM and connected to receive a low humidity gas having relative humidity of 10% or less is operated to flow the received low humidity gas across an access opening of the housing of the EFEM across which the at least one semiconductor wafer is transferred.

In some embodiments of the wafer handling method of the immediately preceding paragraph, the gas flow device comprises a plenum chamber, gas inlet nozzles, and a filter layer. The plenum chamber includes a gas-permeable saturated pressure layer forming a wall of the plenum chamber. The gas-permeable saturated pressure layer has a gas inlet surface forming an inner surface of the plenum chamber and a gas outlet surface forming an outer surface of the plenum chamber. The gas inlet nozzles are arranged to flow the low humidity gas into the plenum chamber at a gas inlet edge of the gas-permeable saturated pressure layer. The filter layer is arranged to receive the low humidity gas exiting the plenum chamber at the gas outlet surface of the gas-permeable saturated pressure layer. The gas-permeable saturated pressure layer has permeability for the low humidity gas that increases with increasing distance from the gas inlet edge.

In some such embodiments, the gas-permeable saturated pressure layer has holes passing from the gas inlet surface to the gas outlet surface, and the permeability for the low humidity gas that increases with increasing distance from the gas inlet edge is provided by at least one of (i) a size of the holes that increases with increasing distance from the gas inlet edge and/or (ii) a density of the holes that increases with increasing distance from the gas inlet edge.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A wafer handling apparatus comprising:
   a load port configured to receive an associated wafer carrier;
   an equipment front end module (EFEM) having a housing and configured to transfer semiconductor wafers to and from the associated wafer carrier received at the load port via an access opening of the housing of the EFEM and configured to transfer the semiconductor wafers to and from an associated semiconductor processing or characterization tool; and
   a gas flow device disposed inside the housing of the EFEM, the gas flow device including:
      at least one saturated pressure layer having a gas inlet surface, a gas outlet surface, and holes passing through the saturated pressure layer from the gas inlet surface to the gas outlet surface;
      one or more gas nozzles arranged to flow a gas over the gas inlet surface of the saturated pressure layer from a gas inlet edge of the saturated pressure layer;
      a gas entry layer disposed at the gas inlet surface of the saturated pressure layer; and
      at least one uniform layer disposed at the gas outlet surface of the saturated pressure layer;
   wherein at least one of (i) a size of the holes passing through the saturated pressure layer increases with increasing distance from the gas inlet edge of the saturated pressure layer and/or (ii) a density of the holes passing through the saturated pressure layer increases with increasing distance from the gas inlet edge of the saturated pressure layer.

2. The wafer handling apparatus of claim 1 wherein the size of the holes passing through the saturated pressure layer increases with increasing distance from the gas inlet edge of the saturated pressure layer.

3. The wafer handling apparatus of claim 2 wherein the holes passing through the saturated pressure layer are arranged as mutually parallel straight lines of holes that are also parallel with the gas inlet side of the saturated pressure layer, and the holes of each straight line of holes have increasing hole size with increasing distance of the straight line of holes away from the gas inlet side.

4. The wafer handling apparatus of claim 1 wherein the density of the holes passing through the saturated pressure layer increases with increasing distance from the gas inlet edge of the saturated pressure layer.

5. The wafer handling apparatus of claim 4 wherein the holes passing through the saturated pressure layer are arranged as mutually parallel straight lines of holes that are also parallel with the gas inlet side of the saturated pressure layer, and the holes of each straight line of holes have increasing hole size with increasing distance of the straight line of holes away from the gas inlet side.

6. The wafer handling apparatus of claim 4 wherein the holes passing through the saturated pressure layer are arranged as mutually parallel straight lines of holes that are also parallel with the gas inlet side of the saturated pressure layer, and the holes of each straight line of holes have decreasing hole spacing along the straight line of holes with increasing distance of the straight line of holes away from the gas inlet side.

7. The wafer handling apparatus of claim 1 wherein the uniform layer comprises a pleated filter layer.

8. The wafer handling apparatus of claim 7 wherein pleats of the pleated filter layer have a height of between 2 mm and 40 mm and a pitch of between 0.1 mm and 2 mm.

9. The wafer handling apparatus of claim 1 further comprising a diversion layer within which at least a portion of the at least one uniform layer is disposed, the diversion layer having a thickness of at least 3 millimeters.

10. The wafer handling apparatus of claim 1 further comprising at least one of at least one O-ring and at least one connect layer disposed at the gas outlet surface of the saturated pressure layer and providing a sealed connection between the gas outlet surface and the at least one uniform layer.

11. A wafer handling apparatus comprising:
a load port configured to receive an associated wafer carrier;
an equipment front end module (EFEM) having a housing and configured to transfer semiconductor wafers to and from the associated wafer carrier received at the load port via an access opening of the housing of the EFEM and configured to transfer the semiconductor wafers to and from an associated semiconductor processing or characterization tool; and
a gas flow device disposed inside the housing of the EFEM and connected to receive a low humidity gas having relative humidity of 10% or less and positioned to flow the received low humidity gas across the access opening of the housing of the EFEM.

12. The wafer handling apparatus of claim 11 wherein the gas flow device includes:
a plenum chamber including a saturated pressure layer forming a wall of the plenum chamber, the saturated pressure layer having a gas inlet surface forming an inner surface of the plenum chamber and a gas outlet surface forming an outer surface of the plenum chamber,
wherein the plenum chamber is connected to receive the low humidity gas into the plenum chamber at a gas inlet edge of the saturated pressure layer, and the saturated pressure layer has permeability for the low humidity gas that increases with increasing distance from the gas inlet edge.

13. The wafer handling apparatus of claim 12 wherein the saturated pressure layer has holes passing through the saturated pressure layer from the gas inlet surface to the gas outlet surface, and the permeability for the low humidity gas that increases with increasing distance from the gas inlet edge is provided by at least one of (i) a size of the holes passing through the saturated pressure layer that increases with increasing distance from the gas inlet edge of the saturated pressure layer and/or (ii) a density of the holes passing through the saturated pressure layer that increases with increasing distance from the gas inlet edge of the saturated pressure layer.

14. The wafer handling apparatus of claim 12 wherein the gas flow device further includes:
a filter layer arranged to receive the low humidity gas exiting the plenum chamber at the gas outlet surface of the saturated pressure layer.

15. The wafer handling apparatus of claim 11 wherein the load port is configured to receive the associated wafer carrier comprising a front opening unified pod (FOUP), and the access opening of the housing of the EFEM is configured to mate with a front opening of the FOUP.

16. The wafer handling apparatus of claim 15 wherein:
the access opening of the housing of the EFEM passes through a vertical wall of the housing of the EFEM, and
the gas flow device is mounted inside the housing of the EFEM on the vertical wall above the access opening and is oriented to flow the received low humidity gas downward across the access opening of the housing of the EFEM.

17. The wafer handling apparatus of claim 11 wherein the EFEM includes an airflow unit with an air filter through which air from outside of the housing of the EFEM is flowed downward into an interior of the housing of the EFEM.

18. A wafer handling method comprising:
transferring at least one semiconductor wafer from a wafer carrier to a tool using an equipment front end module (EFEM);
after processing or characterization of the at least one semiconductor wafer using the tool, transferring the at least one semiconductor wafer from the tool to the wafer carrier using the EFEM; and
at least during the transferring operations, operating a gas flow device disposed inside a housing of the EFEM and connected to receive a low humidity gas having relative humidity of 10% or less to flow the received low humidity gas across an access opening of the housing of the EFEM across which the at least one semiconductor wafer is transferred.

19. The wafer handling method of claim 18 wherein the gas flow device comprises:
a plenum chamber including a gas-permeable saturated pressure layer forming a wall of the plenum chamber, the gas-permeable saturated pressure layer having a gas inlet surface forming an inner surface of the plenum chamber and a gas outlet surface forming an outer surface of the plenum chamber;
gas inlet nozzles arranged to flow the low humidity gas into the plenum chamber at a gas inlet edge of the gas-permeable saturated pressure layer; and
a filter layer arranged to receive the low humidity gas exiting the plenum chamber at the gas outlet surface of the gas-permeable saturated pressure layer;
wherein the gas-permeable saturated pressure layer has permeability for the low humidity gas that increases with increasing distance from the gas inlet edge.

20. The wafer handling method of claim 19 wherein the gas-permeable saturated pressure layer has holes passing from the gas inlet surface to the gas outlet surface, and the permeability for the low humidity gas that increases with increasing distance from the gas inlet edge is provided by at least one of (i) a size of the holes that increases with increasing distance from the gas inlet edge and/or (ii) a density of the holes that increases with increasing distance from the gas inlet edge.

* * * * *